(12) United States Patent
McGowan

(10) Patent No.: US 6,821,082 B2
(45) Date of Patent: Nov. 23, 2004

(54) WAFER MANAGEMENT SYSTEM AND METHODS FOR MANAGING WAFERS

(75) Inventor: Richard McGowan, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 239 days.

(21) Appl. No.: 10/016,610

(22) Filed: Oct. 30, 2001

(65) Prior Publication Data

US 2003/0082032 A1 May 1, 2003

(51) Int. Cl.⁷ .............................................. B65G 49/07
(52) U.S. Cl. ...................... 414/805; 414/217; 414/935; 414/940
(58) Field of Search ................... 414/273, 277, 414/285, 935, 940, 805, 217

(56) References Cited

U.S. PATENT DOCUMENTS

| | | | | |
|---|---|---|---|---|
| 4,178,113 A | * | 12/1979 | Beaver, II et al. | 406/10 |
| 4,293,249 A | * | 10/1981 | Whelan | 406/72 |
| 5,388,945 A | * | 2/1995 | Garric et al. | 414/217 |
| 5,536,128 A | * | 7/1996 | Shimoyashiro et al. | 414/273 |
| 5,668,056 A | * | 9/1997 | Wu et al. | 438/106 |
| 6,134,482 A | * | 10/2000 | Iwasaki | 700/121 |
| 6,157,866 A | * | 12/2000 | Conboy et al. | 700/121 |
| 6,223,886 B1 | * | 5/2001 | Bonora et al. | 198/465.2 |
| 6,286,230 B1 | * | 9/2001 | White et al. | 34/403 |
| 6,354,781 B1 | * | 3/2002 | Pan | 414/217 |
| 6,622,845 B1 | * | 9/2003 | Heinrich et al. | 198/349 |
| 6,643,558 B2 | * | 11/2003 | Huber et al. | 700/112 |

* cited by examiner

Primary Examiner—Steven A. Bratlie

(57) ABSTRACT

A wafer management system has a first stationary wafer storage system (100) with a first buffer (110) for storing a plurality of wafers in slots, a first load-and-unload station (115) for transferring the wafers between the first buffer (110) and intra-bay pods (120, 130) assigned to a first bay (160), and a second load-and-unload station (184) for transferring wafers between the first buffer (110) and further pods (520, 530). The storage system (100) and the bay (160) form a single unit. Multiple units are linked together by tracks (500).

5 Claims, 2 Drawing Sheets

WAFER MANAGEMENT SYSTEM AND METHODS FOR MANAGING WAFERS

FIELD OF THE INVENTION

The present invention generally relates to the field of semiconductor production, and more particularly to a wafer storage and management system and methods for managing wafers.

BACKGROUND OF THE INVENTION

Semiconductor wafers or other such substrates are typically subjected to many processing steps that involve moving said wafers from one type of processing tool to another. For example, wafers that have been subjected to one process in a wafer deposition chamber may have to be moved for cleaning and drying to another processing tool, and then they may have to be transferred to a different processing tool for additional processing steps. In many cases the wafers have to be stored between different processing steps. In accordance with the prior art the pods for transferring the wafers from one processing tool to another are also used for this storage. Therefore, a large number of such pods are required in semiconductor production fabs in accordance with the prior art.

A further problem related with the prior art is that, for transporting wafers between different bays, inter-bay pods have to be used. However, due to these inter-bay pods there is a serious risk of cross-contaminations between these different bays.

The present invention seeks to provide a wafer management system and methods for managing wafers that reduce the storage space required for wafers, reduce the number of necessary pods, reduce the risk of cross-contaminations between different bays and allow greater control of wafer management.

DETAILED DESCRIPTION OF THE PREFERRED EMBODIMENT

Figure 1:
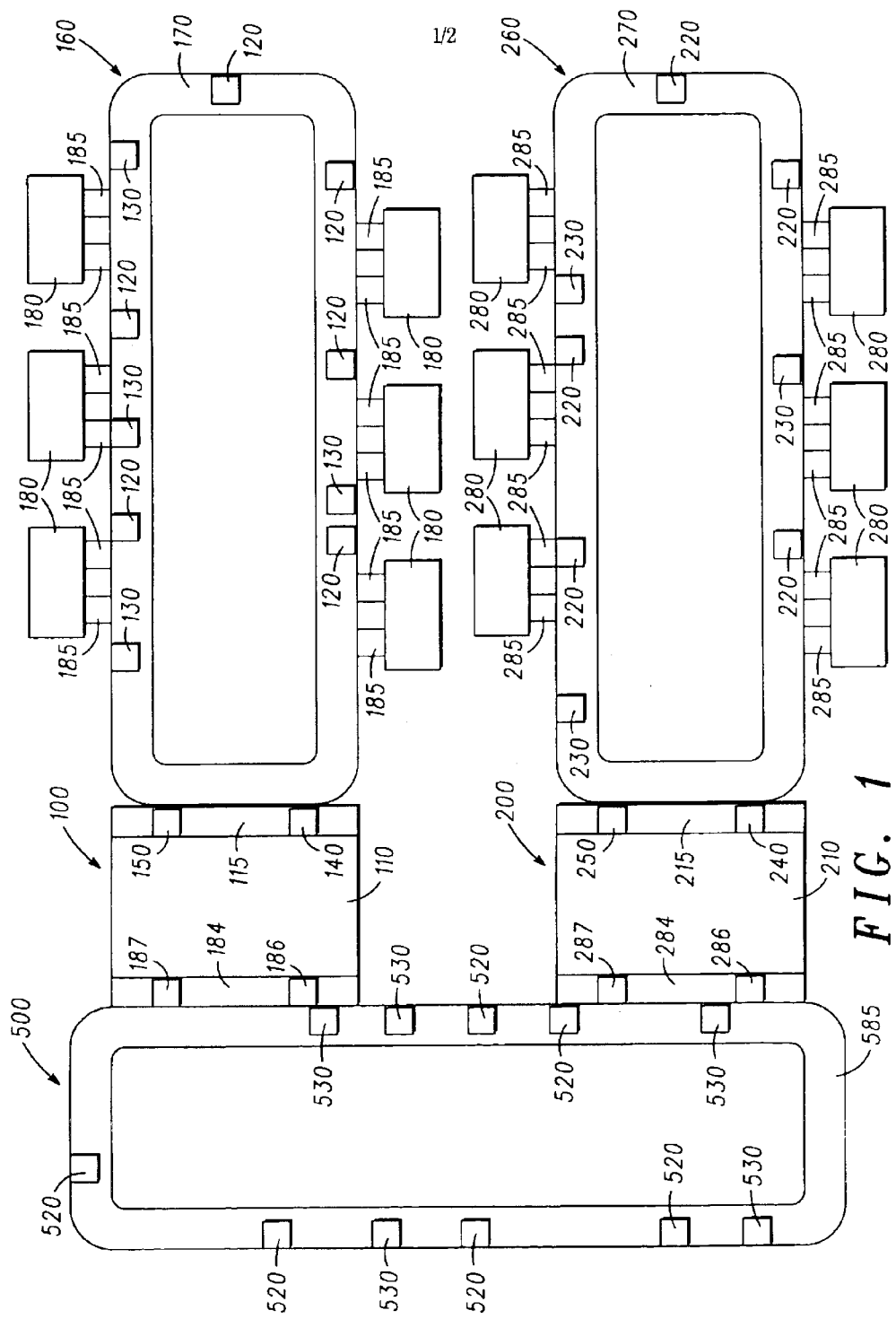
FIG. 1 is a schematic top view of a wafer management system in accordance with an embodiment of the present invention.

In accordance with the present invention a wafer management system is provided, comprising at least a first stationary wafer storage system 100, said first stationary wafer storage system 100 having a first buffer 110 for storing a plurality of wafers out of pods (i.e., outside pods), a first load-and-unload station 115 for transferring wafers between said first buffer 110 and first intra-bay pods 120, 130, both pod types being assigned to a first bay 160, and a second load-and-unload station 184 for transferring wafers between said first buffer 110 and pods 520, 530, both pod types being assigned to an inter-bay transfer means 500.

In accordance with the present invention there is further provided a method for managing wafers, said method comprising the following steps:

a) transferring wafers into a first stationary wafer storage system 100 having a first buffer 110 for storing a plurality of wafers out of pods, b) transferring selected wafers from said first buffer 110 to first intra-bay pods 120, 130 assigned to a first bay 160 via a first load-and-unload station 115 of said first stationary wafer storage system 100, or to inter-bay pods 520, 530 via a second load-and-unload station 184 of said first stationary wafer storage system 100.

A further method in accordance with the present invention for transporting wafers from a first processing tool 180 assigned to a first bay 160 to a second processing tool 280 assigned to a second bay 260, comprising the following steps:

transferring said wafers from said first processing tool 180 to at least one first intra-bay pod 120, 130;

transporting said at least one intra-bay pod 120, 130 to a first stationary storage system 100 comprising a first buffer 110 for storing a plurality of wafers out of pods;

transferring said wafers into said first buffer 110 via a first load-and-unload station 115;

transferring said wafers from said first buffer 110 to at least one pod 520, 530;

transporting said at least one pod 520, 530 to a second stationary storage system 200 comprising a second buffer 210 for storing a plurality of wafers out of pods;

transferring said wafers from said at least one pod 520, 530 into said second buffer 210;

transferring said wafers from said second buffer 210 to at least one second intra-bay pod 220, 230;

transporting said at least one second intra-bay pod 220, 230 to said second processing tool 280; and transferring said wafers from said at least one second intra-bay pod 220, 230 to said second processing tool 280.

In accordance with the present invention there is provided at least one stationary wafer storage system, which, for example, may store a few thousands of wafers, it is therefore possible to significantly reduce the number of required pods used for the wafer storage in accordance with the prior art.

Furthermore, the risk of cross-contaminations between different bays is significantly reduced because the present invention does not require the pods to travel between different bays.

A further advantage of using at least a first stationary storage system performing central management functions is that the number of necessary pod transports may be minimized. For example, small lot sizes may be combined in a single pod.

For performing the central management functions, the stationary storage system is, preferably, capable of labeling wafers and/or pods with information and of reading information from the wafers and/or pods (said information concerning, for example, at least one or more of the following fields: wafer identification, lot identification, place of storage in said first stationary storage system, processing status). Thereby, a handshake between the pods and the processing tools may be avoided in many cases.

FIG. 1 shows a schematic top view of a wafer management system in accordance with an embodiment of the present invention. In accordance with FIG. 1 there is provided a first stationary storage system 100 which is capable of storing a plurality of wafers, for example, 1000, 5000, or 10000 wafers. The first stationary wafer storage system 100 comprises a first buffer 110, which will be discussed in detail in connection with FIG. 2. To avoid a cross contamination of the wafers stored in the first buffer 110, the wafers are stored in a laminar gas flow within said buffer 110. The first stationary wafer storage system 100 further comprises a first load-and-unload station 115. This first load-and-unload station 115 is provided with first reading means 140 for reading the information provided on the wafers and/or on said first intra-bay pods 130. This first reading means 140 may be realized, for example, by a barcode reading system and/or through any suitable optical character recognition (OCR) system. The first load-and-unload station 115 is further provided with first writing means 150 for writing information provided on the wafers and/or on said first intra-bay pods 130. The first writing means 150 may be realized, for example, through a barcode write system. The first stationary wafer storage system 100 further comprises a second load-and-unload station 184 which may also comprise labeling and reading means.

The wafer management system in accordance with FIG. 1 further comprises at least a second stationary wafer storage system 200 which has a similar structure as the first stationary wafer storage system 100 and comprises a respective buffer 210, a third load-and-unload station 215 equipped with second reading means 240 and second writing means 250, and a fourth load-and-unload station 284.

Adjacent to the first stationary wafer storage system 100 there is provided a first bay 160 for processing wafers. This first bay 160 comprises a plurality of wafer processing tools 180 that are capable of performing processing steps to the wafers necessary for the semiconductor device production. The single processing tools 180 are connected by a first track 170. Empty first intra-bay pods 120 travel together with full first intra-bay pods 130 along the first track 170. The pods 120, 130 may, for example, be FOUPs (Front Opening Unified Pods) or SMIF (Standard Mechanical InterFace) boxes and are able to transport wafers to and away from the processing tools 180.

The term "full" is a convenient abbreviation that qualifies a pod that carries at least one wafer but not necessarily in all available wafer slots. The term "empty" is a convenient abbreviation that qualifies a pod that is able to receive at least one wafer but does not necessarily carry any wafer.

To transfer the wafers between the pods and the processing tools 180 there is provided suitable load-and-unload equipment generally known in the art. The processing tools 180 may also be equipped with suitable reading devices 185 for reading information provided on the wafers and/or the intra-bay pods 120, 130. However, such reading devices 185 are, preferably, omitted if the stationary storage system performs the central managing functions.

Adjacent to the second stationary wafer storage system 200 there is provided a second bay 260. This second bay 260 has a similar structure as the first bay 160 and comprises a second track 270, empty second intra-bay pods 220, full second intra-bay pods 230, processing tools 280, and reading devices 285 which may be omitted if the second stationary storage systems performs the central managing functions such that a handshake between the second processing tools 280 and the second intra-bay pods 220, 230 is not necessary.

For making wafer transfers between the first stationary wafer storage system 100 and the second stationary wafer storage system 200 possible, there are provided coupling means 500. These coupling means 500 comprise a third track 585 along which empty pods 520 and full pods 530 travel. With the embodiment shown in FIG. 1, the pods 520, 530 may be referred to as empty inter stationary storage system pods 520 and full inter stationary storage system pods 530, since these pods only travel between the stationary storage systems 100, 200. It is also convenient to refer to these pods as inter-bay pods 520, 530, although the pods are, in general, not directly contacting the bays 160, 260. The present invention is not limited to such inter stationary storage system pods 520, 530. In contrary to the first and second intra-bay pods 120, 130, 220, 230 the pods 520, 530 may, for example, travel to further bays or stationary storage systems.

Figure 2:
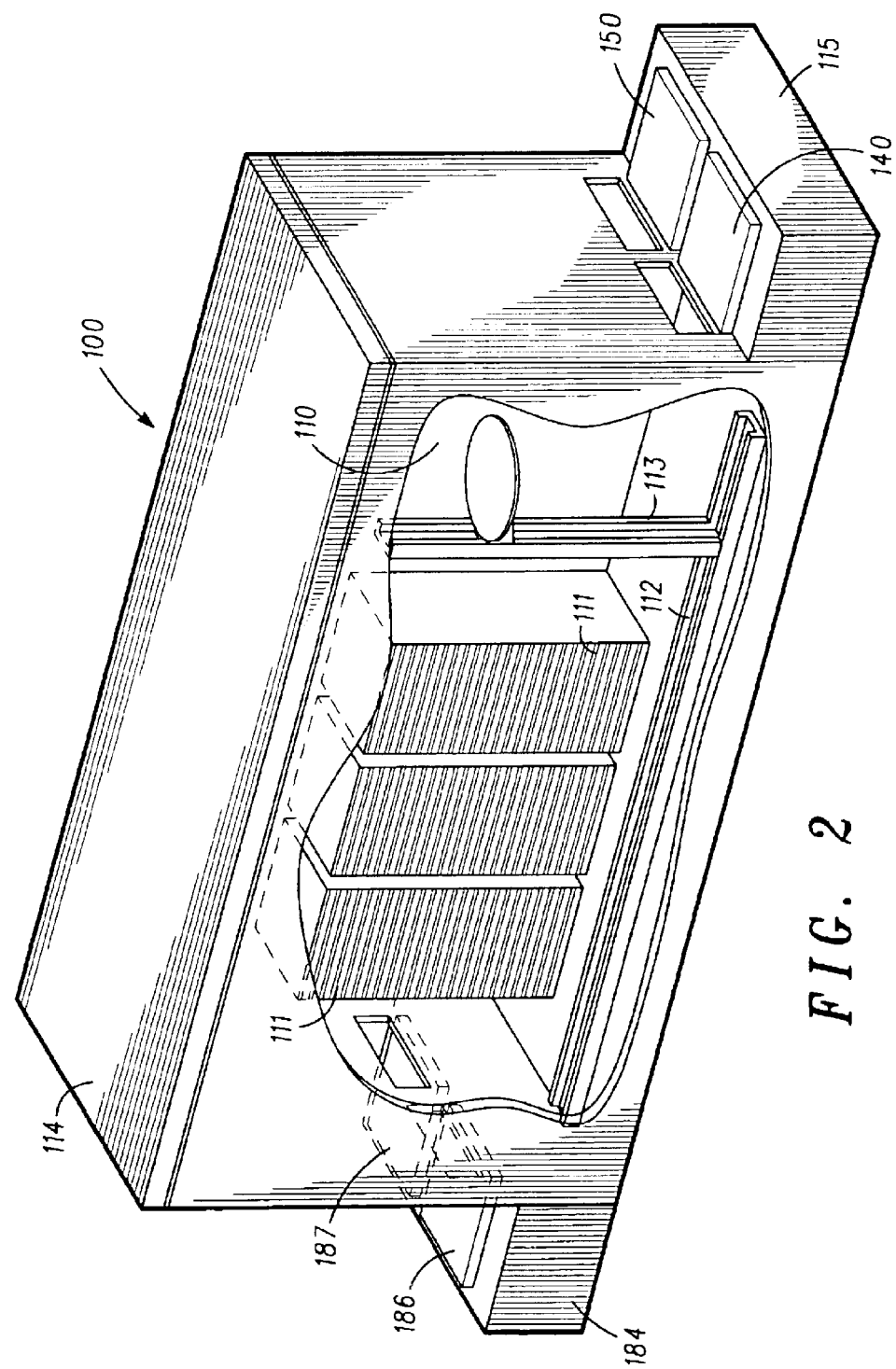
FIG. 2 is a schematic perspective partial cut away view showing a buffer of a stationary wafer storage system used with the wafer management system in accordance with the present invention.

FIG. 2 is a schematic perspective partial cut away view showing a buffer 110 of a stationary wafer storage system used with the wafer management system in accordance with the present invention. Components that correspond to components from FIG. 1 are shown using identical reference numerals. Additionally to FIG. 1 it is shown that the buffer 100 comprises of slots 111 for holding wafers. Further, a horizontally movable rail 112 and a vertically movable arm 113 are provided. On top of the buffer 110 a laminar flow hood 114 is arranged.

Referring to FIGS. 1–2, the function of the wafer management system is explained. It is assumed, that all wafers, stored in laminar flow and out-with the pods on racks, have come from pods 530 or 130. The exact position, identity and lot origin is known for each wafer. On demand, the storage system will transfer wafers to empty pods 520 (if they are required in another location, e.g. another bay) or to empty pods 120 (if they are required for processing within bay 160). The wafer transfer arm 113 has the capability for OCR (Optical Character Recognition) and can read wafer identity (ID) as the wafer is transported. The robot transfer arm 113 can have the capability for more-than single wafer transfers.

As the transfer to the empty pod 120 is performed, the pod is written with the lot and wafer ID via a barcode writer in the load station 115. The information written, in the case of pod 120 will direct the intended tool 180 as to the process required. In cases of small lot sizes, more than one lot can be transported in one pod to the next operation. A pod 120 or a pod 520 will become a pod 130 or a pod 530 when loaded with wafers. A pod 130 or a pod 530 will become a pod 120 or a pod 520 when wafers are removed from it.

Wafers once processed on tool 180 may require further processing in any other bay (e.g. by the processing tools 280). These wafers are carried from the tool 180 in pod 130 to unload station 115 that is provided with a read station 140. Here, wafer and lot ID are recorded and the wafers are transferred to slots 111 or transferred to pod 520 directly. The availability of a pod 520 dictates whether the wafers are stored in slots 111 or transferred immediately. The wafers are transferred to pod 520 at load-and-unload station 184. Load-and-unload station 184 is provided with a writing unload station and, thus, has a write capability to the pod. The pod 520 becomes a pod 530 and is labeled with lot and wafer information. The pod 530 is transported inter-bay on track 500 to the nearest available stocker to the required bay (e.g. to the second bay 260). The pod 530 is placed on unload station 286 where the lot and wafer ID are read. The wafers are stored in slots or transferred directly to an empty pod 220.

When the wafers are transferred to pod 220 via the write-load station 250, the pod 220 becomes a pod 230 and the lot and wafer information are written to the pod 230. The information required for the next process in a tool 280 is downloaded to the tool 280. ID tagging and recipe download in this way negates the requirement for tool handshake. The pod 230 will be carried to the tool 280 for processing. Whilst processing on the tool progresses, the now empty pod 220 will wait at the tool 280 until the wafers are unloaded.

Processed wafers are loaded into a pod 220 still containing the lot data; the data can be updated to include the current process completion. Once filled with processed wafer the full pod 230 is transported back to the storage system 200 and placed on load-and-unload station 215 and in particular to the reading unload station 240 where the lot and wafer ID is read before being transferred to slots or directly to a pod 520. This cycle repeats on many tools, in many bays and between many bays to manage movement of all wafers within the factory.

In special embodiment it is also possible that any bay 160, 260 carries, on the intra-bay track, additional empty pods 120 to allow "special case transfers" where wafers from once pod can be split to two pods coming of the tool 180.

Further, it is envisioned that special instructions can be assigned to wafers stored in slots 111 whereby the wafers from an original single lot can be split into more than one pod for parallel processing.

While the invention has been described in terms of particular structures, devices and methods, those of skill in the art will understand, based on the description herein, that the invention is not limited merely to such examples and that the full scope of the invention is properly determined by the claims that follow.

What is claimed is:

1. A method for transporting wafers from a first processing tool assigned to a first bay to a second processing tool assigned to a second bay, comprising the following steps:

transferring said wafers from said first processing tool to at least one first intra-bay pod;

transporting said at least one intra-bay pod to a first stationary storage system comprising a first buffer for storing a plurality of wafers out of pods;

transferring said wafers into said first buffer via a first load-and-unload station;

reading information from the wafers and labeling the wafers in the first buffer, wherein said labeling comprises storing information on the wafers as to a place of storage in the first stationary storage system;

transferring said wafers from said first buffer to at least one pod;

transporting said at least one pod to a second stationary storage system comprising a second buffer for storing a plurality of wafers out of pods;

transferring said wafers from said at least one pod into said second buffer;

reading information from the wafers and labeling the wafers in the second buffer;

transferring said wafers from said second buffer to at least one second intra-bay pod;

transporting said at least one second intra-bay pod to said second processing tool; and transferring said wafers from said at least one second intra-bay pod to said second processing tool.

2. The method according to claim 1, further comprising the step of transferring said wafers from said first stationary storage system to said second stationary storage system where the first stationary storage system reaches capacity.

3. The method of claim 1, wherein labeling comprises lot identification.

4. The method of claim 1, wherein reading comprises processing status.

5. The method of claim 1, wherein labeling comprises wafer identification.

* * * * *